United States Patent
Ho et al.

(10) Patent No.: US 6,586,343 B1
(45) Date of Patent: Jul. 1, 2003

(54) METHOD AND APPARATUS FOR DIRECTING CONSTITUENTS THROUGH A PROCESSING CHAMBER

(75) Inventors: Henry Ho, San Jose, CA (US); Ying Yu, Cupertino, CA (US); Steven A. Chen, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/350,817

(22) Filed: Jul. 9, 1999

(51) Int. Cl.⁷ .............................................. H01L 21/31
(52) U.S. Cl. ...................... 438/758; 438/778; 438/786; 438/787; 438/791; 118/719; 118/900
(58) Field of Search ................................. 438/778, 786, 438/787, 791, 758; 118/715, 719, 900

(56) References Cited

U.S. PATENT DOCUMENTS

| | | | |
|---|---|---|---|
| 4,792,378 A | 12/1988 | Rose et al. ................. | 438/706 |
| 4,908,095 A | 3/1990 | Kagatsume et al. .......... | 216/67 |
| 4,976,217 A | 12/1990 | Frijlink ....................... | 118/733 |
| 5,399,387 A | 3/1995 | Law et al. ................... | 427/574 |
| 5,516,367 A * | 5/1996 | Lei .............................. | 118/725 |
| 5,589,233 A | 12/1996 | Law et al. ................... | 427/579 |
| 5,882,414 A * | 3/1999 | Fong ........................... | 118/723 |
| 5,895,530 A | 4/1999 | Shrotriya et al. ........... | 118/715 |
| 5,911,834 A | 6/1999 | Fairbairn et al. ............ | 134/1.3 |

* cited by examiner

Primary Examiner—Amir Zarabian
Assistant Examiner—Jeff Vockrodt
(74) Attorney, Agent, or Firm—Blakely Sokoloff Taylor & Zafman

(57) ABSTRACT

A method and apparatus for directing a process gas through a processing apparatus, such as a vapor deposition chamber. The apparatus comprises a pumping plate for a processing chamber having an annular body member wherein said body member has a first portion and a second defining a circumferential edge and a central opening. The first portion comprises a sidewall of the circumferential edge having a plurality of circumferentially spaced through holes and the second portion has comprises a lateral portion that protrudes from the circumferential edge, such that, in a processing chamber, the first portion defines a first gas flow region comprising the central opening and a second gas flow region comprising the lateral portion of the second portion.

18 Claims, 13 Drawing Sheets

METHOD AND APPARATUS FOR DIRECTING CONSTITUENTS THROUGH A PROCESSING CHAMBER

FIELD OF THE INVENTION

The invention relates to the fabrication of integrated circuits. More particularly, the invention provides a method and apparatus for directing process gas through a processing chamber.

BACKGROUND

High density integrated circuits, such as very large scale integration (VLSI) devices, are typically formed on semiconductor wafers by subjecting the wafers to a number of deposition, masking, doping and etching processes. The wafers are placed onto a pedestal or susceptor within a process chamber and process gas(es) are delivered into the chamber onto the wafer to perform the various deposition and etching steps. For example, one typical process involves delivering $SiH_4$ and $N_2$ into the process chamber while applying resistive or conductive heat to form silicon nitride on the wafer. Once the appropriate layer of silicon nitride is deposited onto the wafer, the remaining plasma and gas residue are withdrawn from the process chamber.

One consideration in semiconductor processing is the application of process gases in a uniform and controlled manner across the wafer's entire surface. This consideration is important in the fabrication of large scale integration (LSI) and VLSI devices since a large number of processing steps are generally used in sequence. To achieve uniform processing, existing systems typically introduce gases into the process chamber through a perforated face plate having a plurality of small openings for distributing the gas over the wafer. After the etching or deposition step has been completed, gas residue is withdrawn from the process chamber by a suitable vacuum source, such as a pump. To facilitate uniform pumping dynamics, the process gases will typically be discharged through a number of circumferentially spaced gas inlets in a pumping plate surrounding the susceptor. The gases are then delivered through outlets in the pumping plate into a pumping channel disposed radially outward from and underneath the susceptor.

Many existing systems for directing process gas through semiconductor process chambers suffer from a number of drawbacks. For example, one known device comprises a pumping plate that has a flange that surrounds a pumping plate with six holes. The pressure drop on the various sides of the pumping plate may be the same but the pressure drop from the top and the bottom of the pumping plate are different because the gas holes are restricted by the flange. This flow path tends to have varying pressure drops between the pumping plate and the chamber, thereby disrupting the uniform discharge of the gases about the wafer.

It is desirable to have methods and apparatuses for directing gas(es) through a process chamber that provide improved deposition uniformity.

SUMMARY

Methods and apparatuses are provided for directing constituents through a processing apparatus, such as a vapor deposition chamber. In one aspect, a claimed apparatus comprises a pumping plate for a processing chamber having an annular body member wherein said body member has a first portion and a second defining a circumferential edge and a central opening. The first portion comprises a sidewall of the circumferential edge having a plurality of circumferentially spaced through holes and the second portion has comprises a lateral portion that protrudes from the circumferential edge, such that, in a processing chamber, the first portion defines a first gas flow region comprising the central opening and a second gas flow region comprising the lateral portion of the second portion. By defining two flow regions, the claimed pumping plate establishes a more uniform flow of gas inside a processing chamber over prior art structures which contributes to improved uniformity of film deposition on a substrate.

In another aspect, a vapor deposition processing apparatus includes an enclosure housing a process chamber and a susceptor disposed within the processing chamber for supporting a semiconductor wafer. The apparatus further includes a chamber lid and a perforated face plate for uniformly distributing process gases into the chamber onto the wafer. In this embodiment, the pumping plate has an annular body with an opening therethrough with a longitudinal component and a lateral component extending away from the opening and having a plurality of through holes circumferentially spaced about an axis along longitudinal component. The pumping plate is displaced in the chamber such that an area through the opening in the pumping plate defines a first flow region over a surface of the susceptor and the longitudinal component and the wall of the chamber define a channel of a second flow region. The defined flow regions contribute to more uniform deposition of films than prior art configurations.

Other aspects, features and advantages of the invention will be apparent from the accompanying drawings and from the detailed description that follows below.

BRIEF DESCRIPTION OF THE DRAWINGS

The invention is illustrated by way of example and not by way of limitation in the figures of the accompanying drawings in which like references indicate similar elements.

DETAILED DESCRIPTION

Figure 1:
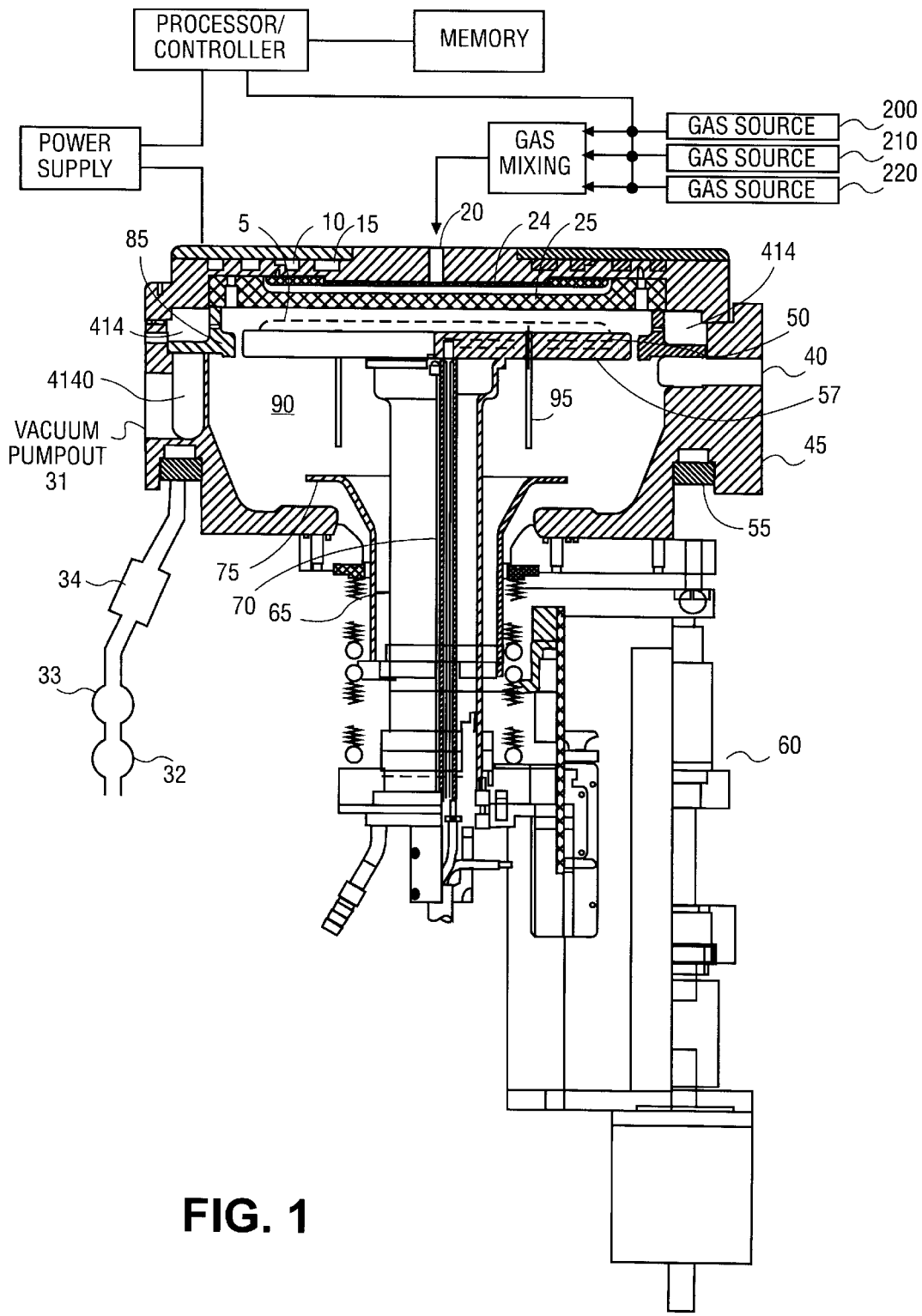
FIG. 1 shows cross-sectional side views of a processing chamber comprising a resistive heater in a "wafer process" position in accordance with an embodiment of the invention through a first cross-section and a section cross-section each through one-half of the chamber.

Referring to the drawings in detail, a representative processing chamber incorporating a pumping plate in accordance with the principles of the invention is described. In one embodiment, the processing chamber is a vapor deposition apparatus that generally includes an enclosure assembly having a vertically movable wafer support pedestal or susceptor (e.g., of a resistive heater) beneath a perforated face plate through which process gas enters a vacuum chamber. A pumping plate extends around the susceptor and discharges the process gas from the chamber into a pumping channel circumscribing the chamber. This allows the pressure drop on either side of the pumping plate, including the top and the bottom of the pumping plate, to be substantially equivalent contributing to more uniform gas flow and improved deposition uniformity over prior art structures.

Although the invention is described herein relative to a resistively-heated processing chamber (FIGS. 1–3), it is to be appreciated that other types of processing chambers may be used in conjunction with the techniques described herein. The invention can also be used in a variety of processing environments, including as a vapor deposition chamber, an etch chamber, diffusion chamber, a plasma chamber or the like.

One skilled in the art will appreciate that although the apparatus is described in terms of gas processing, the invention may also be used with plasma. In this type of application, a controlled plasma may be formed adjacent to the wafer by an energy source such as RF energy that is applied to a face plate from a power supply. The face plate may also have an RF electrode insulated from a chamber lid by a ceramic shield, while the wafer support is grounded. A power supply can supply either single or mixed frequency power to the face plate to enhance the decomposition of reactive species introduced into the processing chamber. The processing chamber is purged using a purge gas introduced to an inlet port or tube through the bottom wall of the enclosure assembly.

Figure 2:
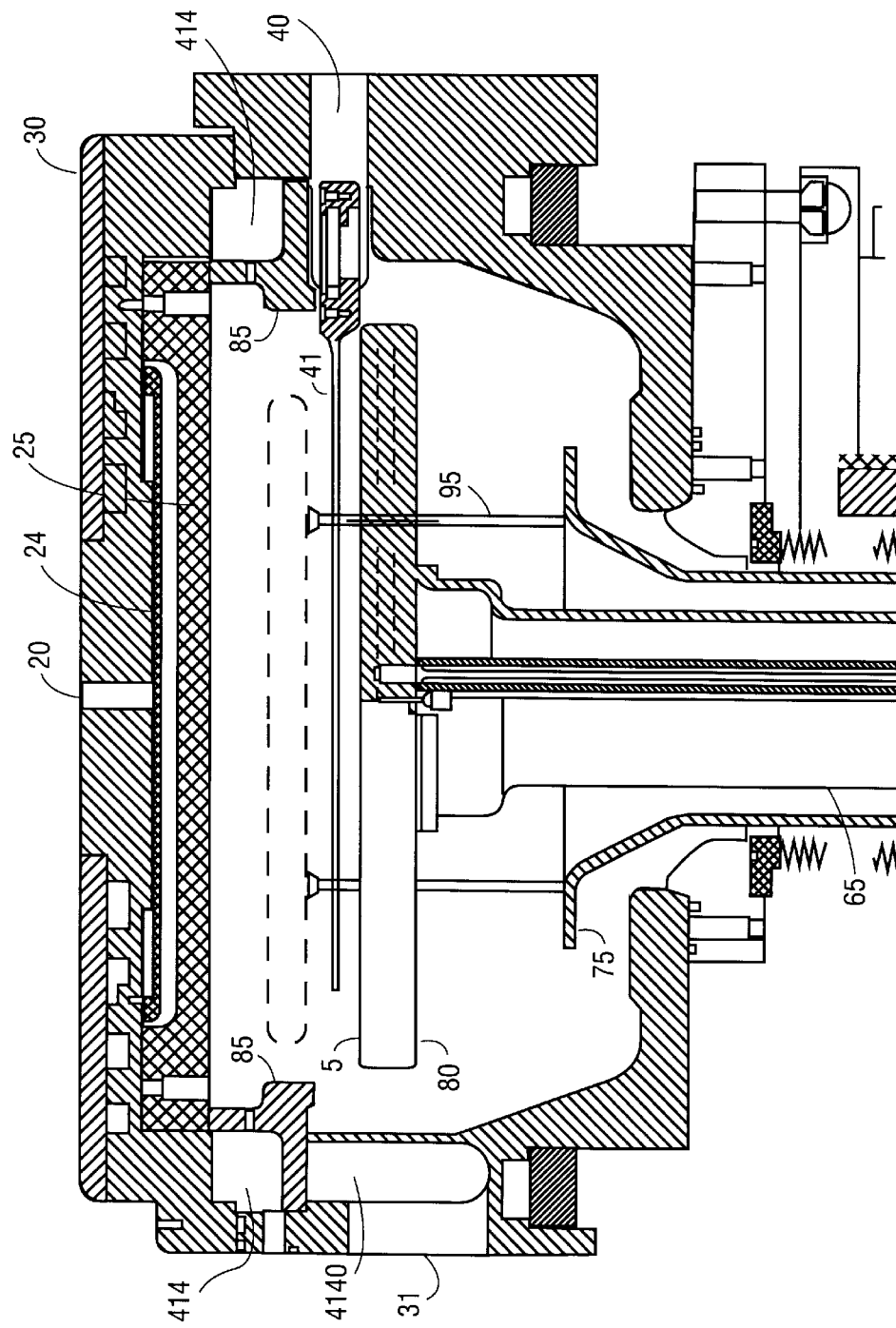
FIG. 2 shows similar cross-sectional side views as in FIG. 1 in a wafer-separate position.
Figure 3:
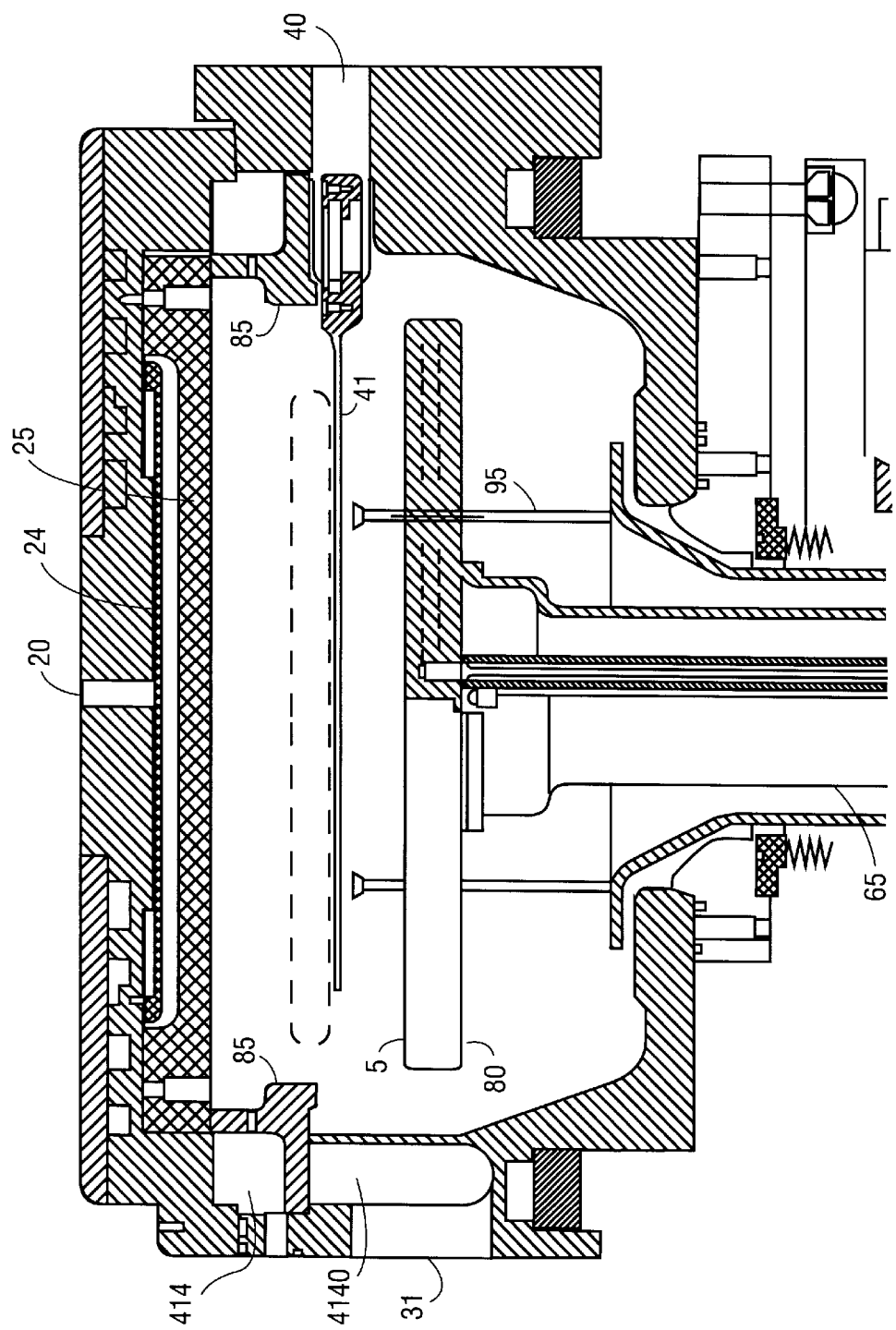
FIG. 3 shows similar cross-sectional side views as in FIG. 1 in a wafer-load position.

Referring to the drawings, a low pressure chemical vapor deposition (LPCVD) chamber is described. FIGS. 1–3 show cross-sectional views of one type of reactor such as a resistive reactor used to practice the invention. FIGS. 1–3 each show cross-sectional views of a chamber through two different cross-sections, each cross-section representing a view through approximately one-half of the chamber.

The LPCVD chamber illustrated in FIGS. 1–3 is constructed of materials such that, in this embodiment, a pressure of greater than or equal to 100 Torr can be maintained. For the purpose of illustration, a chamber of approximately in the range of eight liters is described. FIG. 1 illustrates the inside of process chamber body 45 in a "wafer-process" position. FIG. 2 shows the same view of the chamber in a "wafer-separate" position. FIG. 3 shows the same cross-sectional side view of the chamber in a "wafer-load" position. In each case, a wafer is indicated in dashed lines to indicate its location in the chamber.

FIGS. 1–3 show chamber body 45 that defines reaction chamber 90 in which the reaction between a process gas or gases and the wafer takes place (e.g., a CVD reaction). Chamber body 45 is constructed, in one embodiment, of aluminum and has passages 55 for water to be pumped therethrough to cool chamber body 45 (e.g., a "cold-wall" reaction chamber). Resident in chamber 90 is resistive heater 80 including, in this view, susceptor 5 supported by shaft 65. Susceptor 5 has a surface area sufficient to support a substrate such as a semiconductor wafer (shown in dashed lines).

Process gas enters otherwise sealed chamber 90 through gas distribution port 20 in a top surface of chamber lid 30 of chamber body 45. The process gas then goes through blocker plate 24 to distribute the gas about an area consistent with the surface area of a wafer. Thereafter, the process gas is distributed through perforated face plate 25 located, in this view, above resistive heater 80 and coupled to chamber lid 30 inside chamber 90. One objective of the combination of blocker plate 24 with face plate 25 in this embodiment is to create a uniform distribution of process gas at the substrate, e.g., wafer.

A substrate such as a wafer is placed in chamber 90 on susceptor 5 of heater 80 through entry port 40 in a side portion of chamber body 45. To accommodate a wafer for processing, heater 80 is lowered so that the surface of susceptor 5 is below entry port 40 as shown in FIG. 3. Typically by a robotic transfer mechanism, a wafer is loaded by way of, for example, a transfer blade into chamber 90 onto the superior surface of susceptor 5. Once loaded, entry port 40 is sealed and heater 80 is advanced in a superior (e.g., upward) direction toward face plate 25 by lifter assembly 60 that is, for example, a step motor. The advancement stops when the wafer is a short distance (e.g., 400–700 mils) from face plate 25 (see FIG. 1). In the wafer-process position, chamber 90 is effectively divided into two zones, a first zone above the superior surface of susceptor 5 and a second zone below the inferior surface of susceptor 5. It is generally desirable to confine the film formation to the first zone.

At this point, process gas controlled by a gas panel flows into chamber 90 through gas distribution port 20, through blocker plate 24 and perforated face plate 25. Process gas typically reacts or contacts a wafer to form a film on the wafer. At the same time, an inert bottom-purge gas, e.g., nitrogen, is introduced into the second chamber zone to inhibit film formation in that zone. In a pressure controlled system, the pressure in chamber 90 is established and maintained by a pressure regulator or regulators coupled to chamber 90. In one embodiment, for example, the pressure is established and maintained by baretone pressure regulator (s) coupled to chamber body 45 as known in the art. In this embodiment, the baretone pressure regulator(s) maintains pressure at a level of equal to or greater than 100 Torr. A suitable mid-level pressure range is approximately 100–300 Torr.

Residual process gas is pumped from chamber 90 through pumping plate 85 to a collection vessel at a side of chamber body 45 (vacuum pump-out 31). Pumping plate 85 creates two flow regions resulting in a gas flow pattern that creates a uniform $Si_3N_4$ layer on a substrate.

Pump 32 disposed exterior to apparatus 2 provides vacuum pressure within pumping channel 4140 (below channel 414 in FIGS. 1–3) to draw both the process and purge gases out of the chamber 90 through vacuum pumpout 31. The gas is discharged from chamber 90 along a discharge conduit 33. The flow rate of the discharged gas through channel 4140 is preferably controlled by a throttle valve 34 disposed along conduit 33. The pressure within processing chamber 90 is monitored with sensors (not shown) and controlled by varying the cross-sectional area of conduit 33 with throttle valve 34. Preferably, a controller or processor receives signals from the sensors that indicate the chamber pressure and adjusts throttle valve 34 accordingly to maintain the desired pressure within chamber 90. A suitable throttle valve for use with the present invention is described in U.S. Pat. No. 5,000,225 issued to Murdoch and assigned to Applied Materials, Inc., the complete disclosure of which is incorporated herein by reference.

Once wafer processing is complete, chamber 90 may be purged, for example, with an inert gas, such as nitrogen. After processing and purging, heater 80 is advanced in an inferior direction (e.g., lowered) by lifter assembly 60 to the position shown in FIG. 2. As heater 80 is moved, lift pins 95, having an end extending through openings or throughbores in a surface of susceptor 5 and a second end extending in a cantilevered fashion from an inferior (e.g., lower) surface of susceptor 5, contact lift plate 75 positioned at the base of chamber 90. As is illustrated in FIG. 2, in one embodiment, at this point, lift plate 75 remains at a wafer-process position (i.e., the same position the plate was in FIG. 1). As heater 80 continues to move in an inferior direction through the action of lifter assembly 60, lift pins 95 remain stationary and ultimately extend above the superior or top surface of susceptor 5 to separate a processed wafer from the surface of susceptor 5. The surface of susceptor 5 is moved to a position below opening 40.

Once a processed wafer is separated from the surface of susceptor 5, transfer blade 41 of a robotic mechanism is inserted through opening 40 beneath the heads of lift pins 95 and a wafer supported by the lift pins. Next, lifter assembly 60 inferiorly moves (e.g., lowers) heater 80 and lift plate 75 to a "wafer load" position. By moving lift plate 75 in an inferior direction, lift pins 95 are also moved in an inferior direction, until the surface of the processed wafer contacts the transfer blade. The processed wafer is then removed through entry port 40 by, for example, a robotic transfer mechanism that removes the wafer and transfers the wafer to the next processing step. A second wafer may then be loaded into chamber 90. The steps described above are generally reversed to bring the wafer into a process position. A detailed description of one suitable lifter assembly 60 is described in U.S. Pat. No. 5,772,773, assigned to Applied Materials, Inc., of Santa Clara, Calif.

In a high temperature operation, such as LPCVD processing to form a $Si_3N_4$ film, the reaction temperature inside chamber 90 can be as high as 750° C. or more. Accordingly, the exposed components in chamber 90 must be compatible with such high temperature processing. Such materials should also be compatible with the process gases and other chemicals, such as cleaning chemicals (e.g., $NF_3$) that may be introduced into chamber 90. Exposed surfaces of heater 80 may be comprised of a variety of materials provided that the materials are compatible with the process. For example, susceptor 5 and shaft 65 of heater 80 may be comprised of similar aluminum nitride material. Alternatively, the surface of susceptor 5 may be comprised of high thermally conductive aluminum nitride material (on the order of 95% purity with a thermal conductivity from 140 W/mK to 200 W/mK) while shaft 65 is comprised of a lower thermally conductive aluminum nitride. Susceptor 5 of heater 80 is typically bonded to shaft 65 through diffusion bonding or brazing as such coupling will similarly withstand the environment of chamber 90.

FIG. 1 also shows a cross-section of a portion of heater 80, including a cross-section of the body of susceptor 5 and a cross-section of shaft 65. In this illustration, FIG. 1 shows the body of susceptor 5 having two heating elements formed therein, first heating element 50 and second heating element 57. Each heating element (e.g., heating element 50 and heating element 57) is made of a material with thermal expansion properties similar to the material of the susceptor. A suitable material includes molybdenum (Mo). Each heating element includes a thin layer of molybdenum material in a coiled configuration.

In FIG. 1, second heating element 57 is formed in a plane of the body of susceptor 5 that is located inferior (relative to the surface of susceptor in the figure) to first heating element 50. First heating element 50 and second heating element 57 are separately coupled to power terminals. The power terminals extend in an inferior direction as conductive leads through a longitudinally extending opening through shaft 65 to a power source that supplies the requisite energy to heat the surface of susceptor 5. Extending through openings in chamber lid are two pyrometers, first pyrometer 10 and second pyrometer 15. Each pyrometer provides data about the temperature at the surface of susceptor 5 (or at the surface of a wafer on susceptor 5). Also of note in the cross-section of heater 80 as shown in FIG. 1 is the presence of thermocouple 70. Thermocouple 70 extends through the longitudinally extending opening through shaft 65 to a point just below the superior or top surface of susceptor 5.

In accordance with one embodiment of the invention to form a $Si_3N_4$ film on a wafer, the gases include a carrier gas 200, a nitrogen source gas 220, and a silicon source gas 210. Suitable carrier gas sources include, but are not limited to, hydrogen ($H_2$), nitrogen ($N_2$), argon (Ar), and helium (He). Suitable nitrogen source gas includes, but is not limited to, ammonia ($NH_3$). Suitable silicon source gas includes, but is not limited to, silane, dichlorosilane, and disilene. The nitrogen source gas and the silicon source gas combine to produce a $Si_3N_4$ layer on the wafer.

In use, silicon source gas 210 may be mixed with carrier gas 200 before or during introduction into the processing chamber 90. The mixture of the carrier gas and the silicon source gas is then introduced into gas inlet 20 of chamber 90. Nitrogen source gas 220 is also introduced into gas inlet 20 and allowed to mix with the mixture of the carrier gas and the silicon source gas. The process gas passes through the plurality of holes in a blocker plate 24 and then through the plurality of holes in the face plate 25. These gases then flow into chamber 90 wherein the gases are exposed to a wafer. Thereafter, the process gas exits through the pumping plate 85 into the pumping channel 414.

The flow rate of the gases is dependent upon the size of semiconductor processing chamber 90. In one embodiment, the total flow rate of the gases ranges from five to fifteen liters per minute based upon a total effective volume of a processing chamber of one to nine liters. The ratio of at least one of the gases or the total gas flow rate relative to the chamber is 0.50 to 8 liters per minute per liter of chamber volume.

Exposure of the wafer to the mixture of gases causes deposition of a silicon nitride ($Si_3N_4$) layer on the wafer according to thermal chemical vapor deposition principles. Exposure of the gases to the wafer at an elevated temperature causes dissociation of the molecules of the silicon source gas and the nitrogen source gas into smaller molecules. The smaller molecules then recombine with one another. Provided below is a general chemical reaction that occurs in this process. Silane generally reacts with ammonia according to the chemical equation $$3SiH_4 + 4NH_3 \rightarrow Si_3N_4 + 12H_2$$

As a general rule, the higher the temperature in chamber 90, and therefore of wafer and susceptor, the quicker the silicon nitride layer will form.

In one embodiment, SiH$_4$, NH$_3$, and N$_2$ are introduced with 100 standard cubic centimeters per minute (sccm) of SiH$_4$, 5 standard liters per minute (slm) of NH$_3$, and 10 slm of N$_2$, while wafer is heated to a temperature of between 600° C. and 800° C. During deposition, pressure in the chamber of between 100 to 500 Torr is maintained. A suitable mid-level pressure range is greater than 100 Torr to 350 Torr. In one embodiment, the partial pressure of silane is approximately in the range of 0.05 to 5 Torr and ammonia has a partial pressure equal to or less than 300 Torr in chamber. However, other partial pressures may be used for the silicon and nitrogen source gases which may depend upon the particular gas used.

In another embodiment, gases may be used in the following proportions: SiH$_4$: 70 sccm, NH$_3$: 2 slm, and N$_2$: 8 slm. In yet another embodiment, gases may be used in the following proportions: dichlorosilane (SiH$_2$Cl$_2$): 230 sccm, NH$_3$: 1,000 sccm, and H$_2$: 9,000 sccm. If N$_2$ is used as a carrier gas, a deposition rate of about 50 to 5,000 Å per minute may be achieved at a temperature as low as 600° C.

The above embodiment described controlling conditions in a reaction chamber to form a Si$_3$N$_4$ film on a wafer. It is to be appreciated that such control may be done manually or with the aid of a system controller. In the former instance, an operator may monitor and adjust the power supply to the heater to control the temperature, and a vacuum source to control the pressures. The operator may also manually adjust valves associated with the individual gases to regulate the mixture and flow rate of the gases.

A system controller may also be employed to handle the control tasks associated with system control. FIG. 1 illustrates a system controller or processor coupled to a power supply and a gas manifold. The controller may be configured to record the temperature measured by the temperature indicators and control the power supplied to the heating elements based, for example, on an algorithm that determines a relative value of the temperature difference and adjusts the heating elements accordingly. The controller may also be configured to control the mixture and flow of gases to the processing chamber. In an LPCVD reaction process, the controller may further be coupled to a pressure indicator that measures the pressure in the chamber as well as a vacuum source to adjust the pressure in the chamber.

The system controller is supplied with control signal generation logic. The controller may also be coupled to a user interface that allows an operator to enter the reaction parameters, such as the desired reaction temperature, the acceptable tolerance of a temperature difference between indicators (e.g., ±3° C.), the reaction pressure, and the flow of gases to the processing chamber.

Control signal generation logic is supplied to the system controller in the form of, for example, software instruction logic that is a computer program stored in a computer-readable medium such as the memory of the controller. The computer program includes sets of instructions that dictate the timing, mixture of gases, chamber pressure, chamber temperature, and other parameters of a particular process. It is to be appreciated that other computer programs such as one stored on another memory device, including but not limited to, a floppy disk, may also be used to operate the system, controller.

The computer program code can be written in a computer-readable programming language such as, for example, 68000 assembly language, C, C++, Pascal, Fortran or others. Suitable program code is generally entered into a single file or multiple files using a text editor. If the entered code text is in a high level language, the code is compiled, and the resultant compiler code is then linked with an object code or precompiled object code, the system invokes the object ode, causing the computer system to load the code in memory, from which the central processing unit reads and executes the code to perform the task identified in the program.

In one aspect of the invention, an apparatus and method of improving the uniformity of process/reactant gas distribution is described. As described above, process gas such as a silicon source gas and a nitrogen source gas (along with a carrier gas) is introduced into chamber 90 through gas distribution port 20. The process gas flows through blocker plate 24 and face plate 25 which create a shower-head like cascade of the process gas over a surface of a wafer on the surface of susceptor 5. As gas is introduced into chamber 90 gas is also removed so that a pre-determined pressure may be maintained during processing. In the configuration of the chamber shown in FIGS. 1–3, gas is removed from a side of the chamber, e.g., pumped out at one side designated vacuum pump-out 31. In prior art systems, the asymmetrical removal of gases from one side of the chamber created pressure differences in the chamber; for example, a pressure measured at a point in the chamber nearer a chamber pump-out was different (e.g., less) than a pressure measured at a point distant from the pump-out. The pressure difference contributed to non-uniformity of deposition of a film on a wafer.

In one embodiment of the invention, a pumping plate is provided to direct the flow of gases in the chamber. The pumping plate of the invention defines two gas flow regions: a first flow region of process gases directed at a wafer on the surface of susceptor 5 and a second flow region defined by a radial channel about the pumping plate of gases primarily to be discharged from the chamber. By creating the two regions, a more uniform pressure may be maintained in the chamber. The invention contemplates that a static pressure difference between the two flow regions can be established throughout the chamber contributing to more uniform deposition of films across a wafer.

Figure 4:
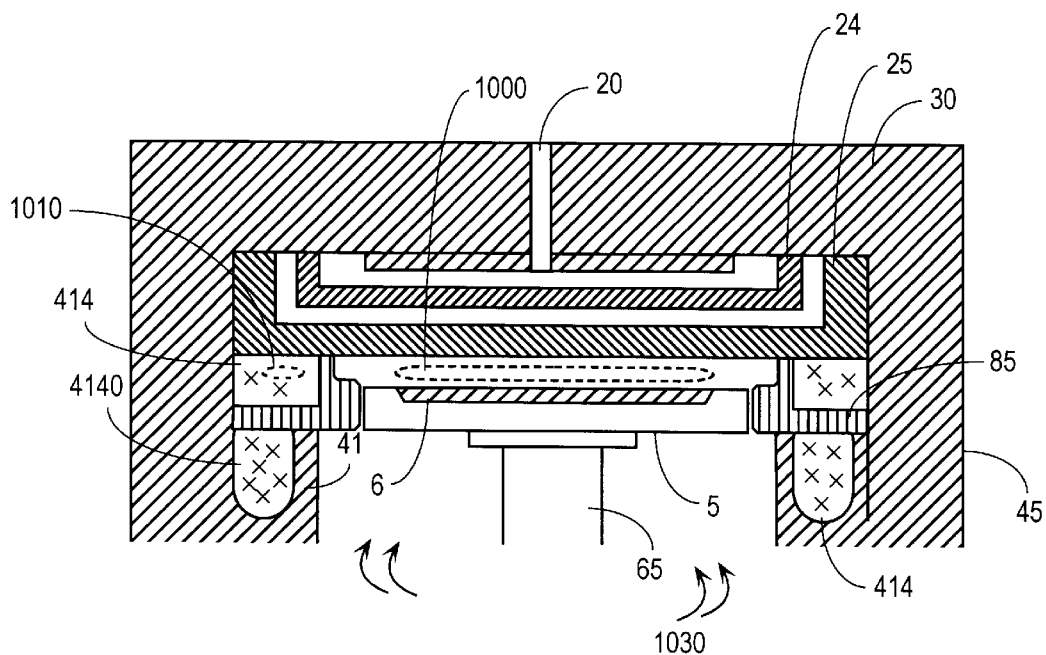
FIG. 4 shows another cross-sectional side view of a portion of a processing chamber position in accordance with an embodiment of the invention.

Referring to FIGS. 4 through 10, components of the invention utilized to coordinate a uniform flow of process gas in the chamber will now be described in detail relative to their use in the resistively-heated processing chamber described in FIGS. 1 through 3. FIG. 4 shows a schematic cross-sectional side view of a portion of a processing chamber. FIG. 4 illustrates a portion of a chamber in a position through a single cross-section to illustrate the two gas flow regions. The cross-section is through a center axis of the chamber to illustrate the location of susceptor 5 relative to pumping plate 85. In the wafer-process position, a portion of susceptor 5 sits within an annular opening of pumping plate 85 (a portion of pumping plate 85 surrounding susceptor 5 is cut-away in this cross-section).

As seen in the illustration in FIG. 4, pumping plate 85 rests on inner chamber portion 41 of chamber wall 45. An underside of pumping plate 85 and inner chamber portion 41 defines channel 4140 extending circumferentially around the chamber. Channel 4140 does not extend completely around the chamber as a portion of a similar chamber area is utilized by entry port 40 to load and remove a wafer. In one embodiment, channel 4140 extends approximately 270° around the chamber. Vacuum pump-out 31 is linked to channel 4140 to discharge gases from the chamber.

As shown in FIG. 4, pumping plate 85 includes (in this view) a vertical annular first stepped portion 464 that forms a circumferential edge of a longitudinal or vertical wall to face plate 25. Second stepped portion 466 comprises a lateral portion that protrudes from the circumferential edge. Together, first stepped portion 464 and second stepped portion 466 define channel 414 between face plate 25, chamber wall 40 and pumping plate 85. The vertical wall separates first flow region 1000 where process gas is directed at a wafer (to be seated in wafer pocket 6 of susceptor 5) from second region 1010 where gas is discharged from the chamber. Gas from first flow region 1000 enters second flow region 1010 through circumferentially located holes (gas holes 490) extending around first portion 464 of pumping plate 85. The flow of gas in second flow region 1010 is radial and second flow region 1010 communicates with channel 4140 to remove gas from the chamber.

Figure 5:
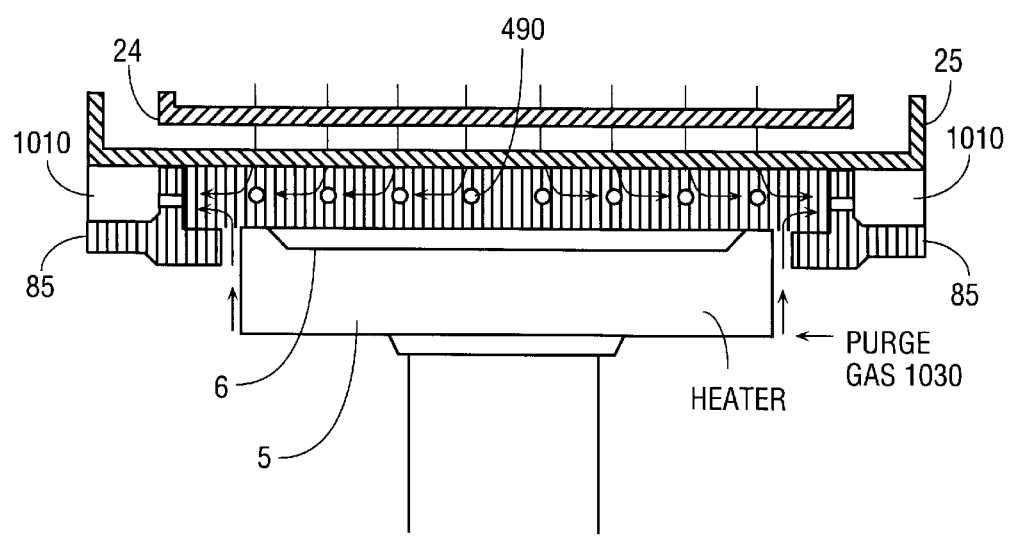
FIG. 5 shows yet another cross-sectional side view of a portion of a processing chamber position in accordance with an embodiment of the invention.
Figure 6:
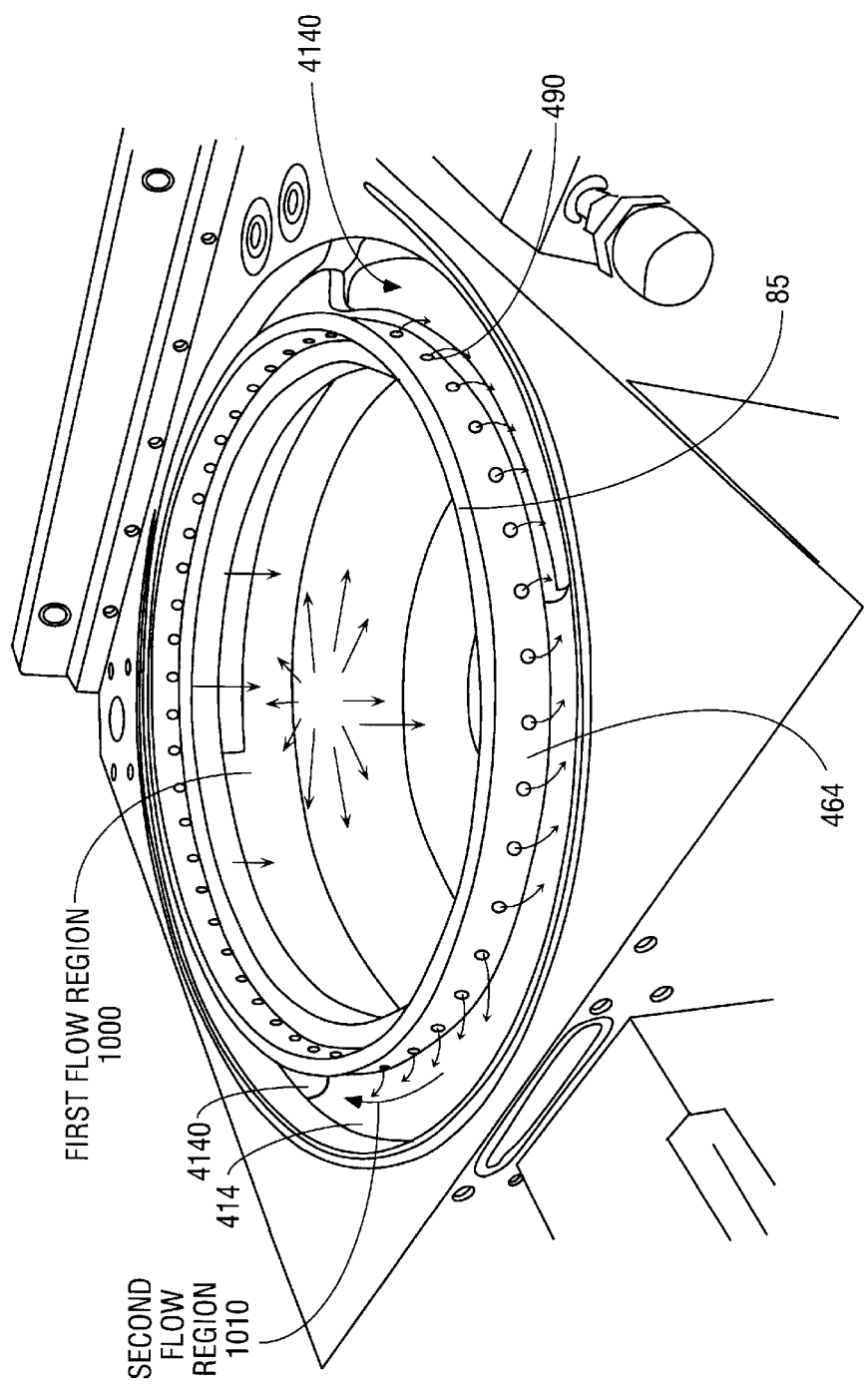
FIG. 6 shows a top perspective view of a portion of a processing chamber with the chamber lid removed in accordance with an embodiment of the invention.

FIGS. 5 and 6 show schematic views of the general flow direction of process gases through the chamber. FIG. 5 is a cross-section through the chamber that shows pumping plate 85 surrounding a portion of susceptor 5. In FIG. 5, process gas is illustrated entering through the gas inlet of the chamber and passing through blocking plate 24 and face plate 25. In first flow region 1000, process gas arrives at the surface of susceptor 5 to react with a wafer in pocket 6 of susceptor 5 and form a film of, for example, $Si_3N_4$ or other desired material (e.g., $SiO_2$, polysilicon, etc.). Residual process gas as well as bottom purge gas 1030 is directed to second flow region 1010 to be discharged from the chamber. Gas enters second flow region 1010 by gas holes 490 circumferentially spaced around pumping plate 85. In this embodiment, the gas holes 490 are positioned to be above the top surface of a wafer on susceptor 5 during processing. In general, gas holes 490 are positioned at least at the level of a wafer or above the wafer when the heater is in the "wafer process" position.

FIG. 6 further shows the process flow of gas entering and exiting pumping plate 85. FIG. 6 is a top perspective view without the resistive heater, the chamber lid, blocking plate, and face plate. FIG. 6 shows generally U-shaped pumping channel 414 that substantially surrounds a susceptor and defines second flow region 1010. Radially oriented gas holes 490 are positioned around the entire perimeter of the pumping plate and communicate with pumping channel 414. Gas holes 490 in the side wall of pumping plate 85 allow gas to flow horizontally into pumping channel 414. Pumping channel 414 communicates with channel 4140 through two large openings in channel 414; openings defined by the absence of sections of lateral second stepped portion 466 of pumping plate 85. Second stepped portion 466 is comprised of two flange portions (see FIG. 7). One flange portion isolates channel 414 from entry port 40 while a second flange portion separates channel 414 from a region of channel 4140 occupied by vacuum pump-out 31. Configuring the flange portions in this manner helps to maintain a uniform pressure in channel 414.

Gas holes 490 in first stepped portion 464 of pumping plate 85 are shown in FIG. 6 substantially evenly spaced apart from one another. Additionally, the gas holes are generally centered in first stepped portion 464 of pumping plate 85. The placement of gas holes 498 in the side wall of pumping plate 85 and the division of first flow region 1000 and second flow region 1010 creates a consistent pressure difference between first flow region 1000 and second flow region 1010. This feature allows the gas flow within the chamber to be more uniform than prior art configurations. In the prior art, a pumping plate had varying pressure differentials at various points along the pumping plate which resulted in non-uniform gas flow regions.

Figure 7:
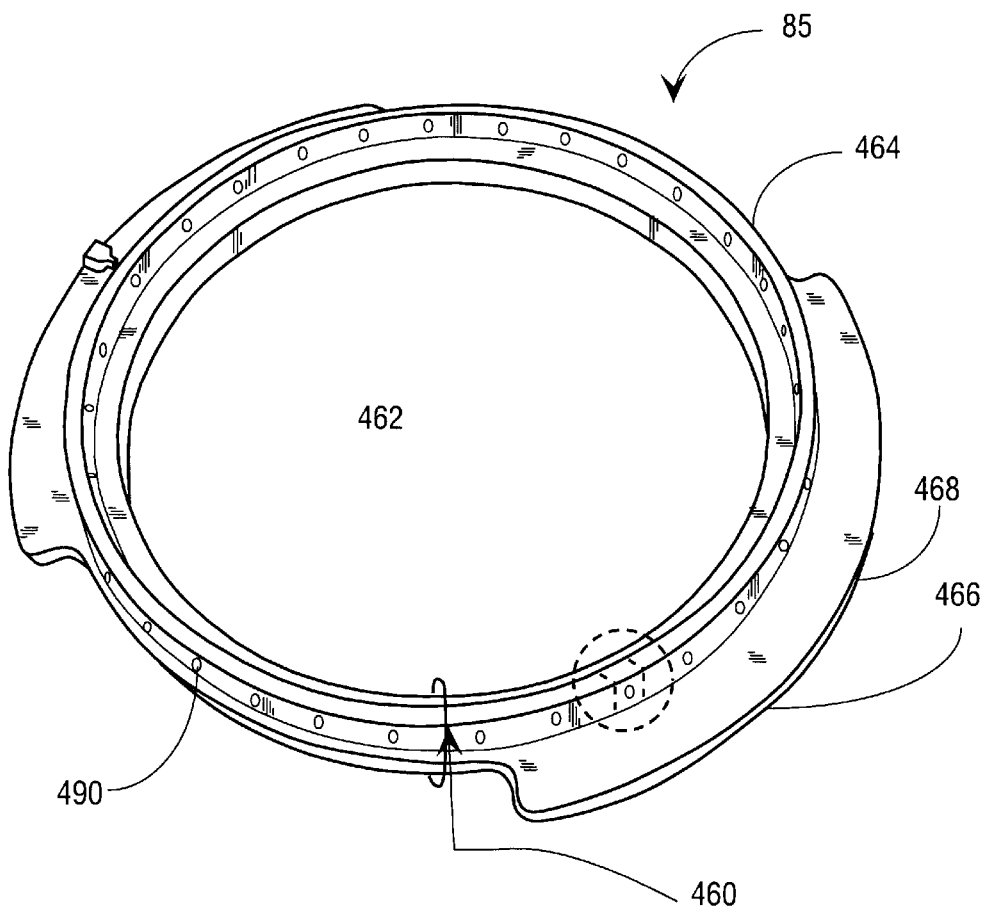
FIG. 7 shows a top perspective view of a pumping plate in accordance with an embodiment of the invention.
Figure 9:
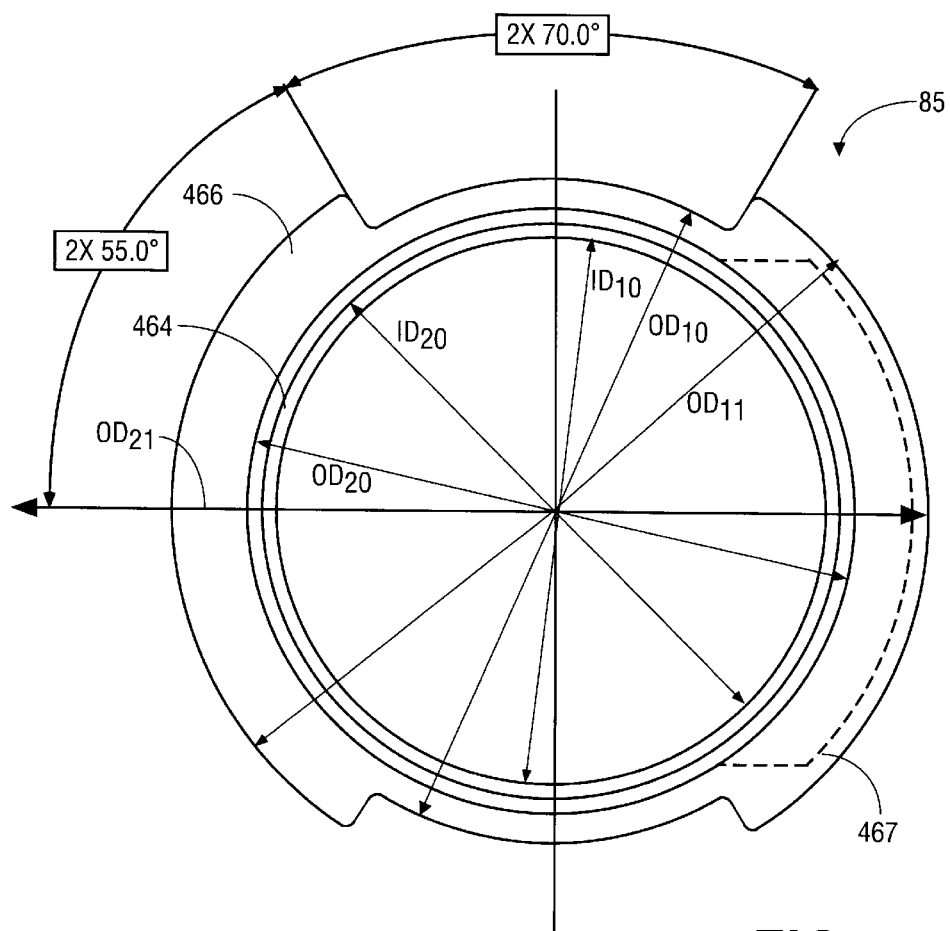
FIG. 9 shows a top plan view of a pumping plate in accordance with an embodiment of the invention.
Figure 10:
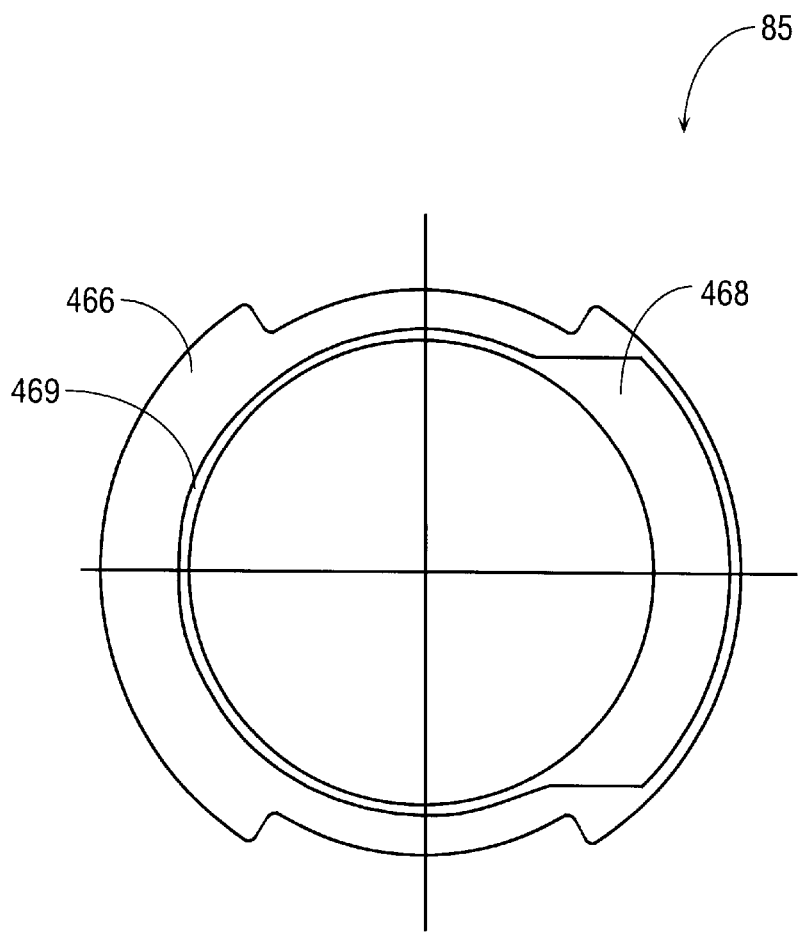
FIG. 10 shows a bottom plan view of a pumping plate in accordance with an embodiment of the invention.
Figure 11:
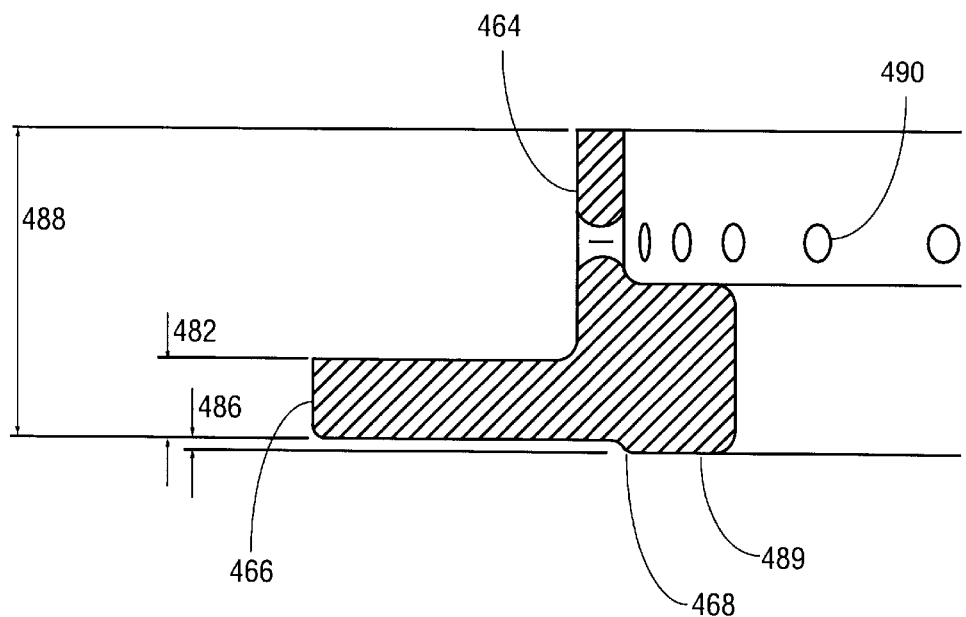
FIG. 11 shows a cross-sectional side view of portion of a pumping plate in accordance with an embodiment of the invention.
Figure 12:
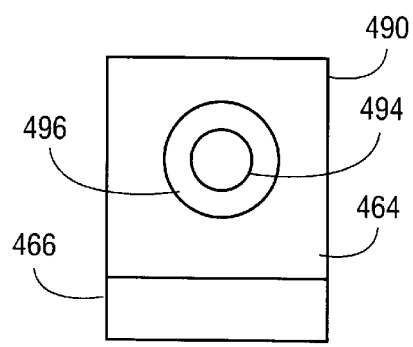
FIG. 12 shows side plan view of a portion of a pumping plate having a single gas hole plate in accordance with an embodiment of the invention.

FIGS. 7–12 illustrate different views of an embodiment, or a portion of an embodiment, of a pumping plate of the invention. FIG. 7 illustrates a perspective top view, FIG. 8 a planar side view, FIG. 9 a planar top view, and FIG. 10 a planar bottom view. FIGS. 11–12 show portions of the pumping plate to more clearly describe certain features.

Pumping plate 85 comprises generally annular member 460. In one embodiment, member 460 is an integral piece comprising a process compatible metal, such as aluminum alloy or preferably C275 aluminum alloy, that will be suitably shaped to fit within a particular semiconductor processing chamber. C275 aluminum alloy is commercially available from Alcoa Advanced Technologies of Engelwood, Colo. Although member 460 is preferably constructed of a single integral piece of metal with different portions of member 460, the pumping plate 85 may be comprised of pieces connected or coupled together.

In the specific configuration described herein, member 460 includes first stepped portion 464, second stepped portion 466, and third stepped portion 468. First stepped portion 464 forms a vertical side wall to define channel 414 and separate second flow region 1010 from first flow region 1000. Second stepped portion 466 defines the lateral portion or floor of pumping channel 414. Third stepped portion 468 serves to align pumping plate 85 in a predetermined position within a processing chamber.

Figure 8:
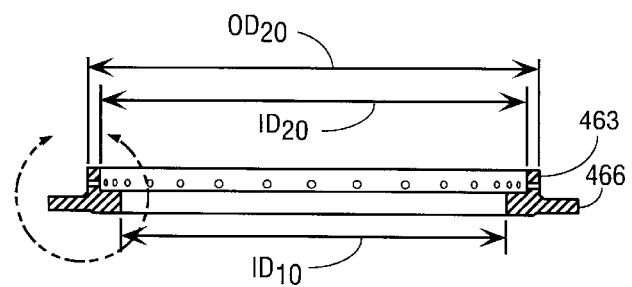
FIG. 8 shows a cross-sectional side view of a pumping plate in accordance with an embodiment of the invention.

In the eight liter processing chamber described with reference to FIGS. 1–3, the thickness of first stepped portion 468 ranges from approximately 0.06 inches to 0.10 inches and is preferably 0.06 inches. With reference to FIGS. 8–9, inner diameter $ID_{10}$ of second stepped portion 466 is, for example, 9.572 inches, and the outer diameter $OD_{10}$ is, for example, 11.25 inches. Inner diameter $ID_{10}$ of second stepped portion 466 is slightly larger than the diameter of susceptor 5 so that susceptor 5 will fit within the opening in annular member 460 of pumping plate 85. In one embodiment, there is approximately 0.12 to 0.18 inches spacing between susceptor 5 and second stepped portion 466. $ID_{20}$ of first stepped portion 464 is 10.4 inches. $OD_{20}$ of first stepped portion 464 is 10.9 inches. As shown in FIG. 11, height 488 of pumping plate 85 in this embodiment is 1.20 inches. The distance between base 489 of the pumping plate (the base of third stepped portion 468) and the central point of gas hole 490 extending through the first stepped portion 464 is 0.728 inches.

Second stepped portion 466 comprises two flange portions which extend the outside diameter from $OD_{10}$ to $OD_{11}$. $OD_{11}$ ranges from a diameter of 12.93 inches. Each flange portion has an area in proportion to an arc defined between two radii of first and second portion of annular member 460, respectively. FIG. 9 shows each flange with a bi-section having an area in proportion to an arc of 55°.

The flange portions of second stepped portion 466 (i.e., the lateral portions) define the base of channel 414 and second flow region 1010. Between each flange portion are provided openings to channel 4140 and vacuum pump-out 31. In one embodiment, an area between flange portions is in proportion to an arc of 70°.

As illustrated by the bottom plan view of FIG. 10, third stepped portion creates a seat for pumping plate 85 to rest on inner chamber portion 41. In this embodiment, third stepped portion 468 includes a single lip portion coinciding with an area similar to an area of one of the flange portions of second stepped portion 466. The lip portion serves, in one aspect, to orient pumping plate 85 in the chamber.

The diameters of the first, second, and third stepped portions of the pumping plate will depend on the characteristics of the individual deposition apparatus, such as the diameter of the perforated face plate 25, the radial distance between pumping channel 414 and chamber 90, the height of susceptor 5 (i.e., the axial distance between channel 414 and chamber 90), and the diameter of the susceptor 5.

Pumping plate 85 comprises a plurality of gas holes 490 through the side wall of first stepped portion 464 that communicate first flow region 1000 with channel 414 and second flow region 1010. In one embodiment, forty-eight gas holes 490 are located in pumping plate 85. As shown in particular in FIGS. 7–8, gas holes 490 are circumferentially spaced around annular opening 462 of body member 460 to facilitate uniform discharge of process gas through gas holes 490. In one configuration, one gas hole 490 is spaced a distance of 7.5° from another gas hole 490. FIG. 11 shows a magnified side plan view of a portion of pumping plate 85. FIG. 12 shows a magnified plan view of one gas hole. FIG. 12 shows gas holes 490 having concave sidewalls so that their outer diameter 496 is larger than their inner diameter 494 at both the inlet and the outlet of the gas hole. The concave sidewalls are preferably smooth to reduce the creation of turbulence of the gas that might contribute to non-uniform gas flow. The concave shape of gas holes 490 also serves to restrict the flow through each particular gas hole which contributes to increased uniformity of flow through all of the gas holes. As seen in FIGS. 11–12, gas holes 490 extend substantially straight through pumping plate 85. In one embodiment, gas holes 490 have a diameter approximately in the range of 0.120 to 0.130 inches and more preferably in the range of 0.122 to 0.125 inches.

Figure 13:
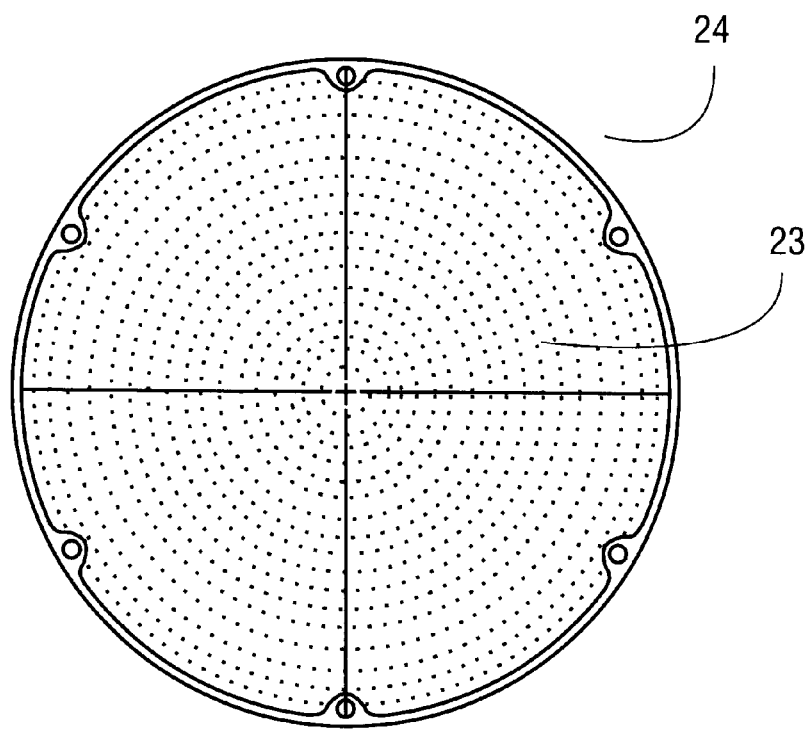
FIG. 13 shows a top plan view of a blocker plate in accordance with an embodiment of the invention.

Process gas enters the processing chamber through relatively narrow gas distribution port 20 (FIGS. 1–3). To distribute the process gas evenly, the processing chamber of the invention is equipped with blocker plate 24 and face plate 25. FIG. 13 shows a top plan view of blocker plate 24. Blocker plate 24 is substantially circular in shape and is coupled to chamber lid 30 through the circumferentially-arranged fastening holes. Blocker plate 24 has through holes 23 for coupling blocker plate 24 to perforated face plate 25. In an embodiment suitable for the eight liter processing chamber described with reference to FIGS. 1–3, blocker plate 24 has approximately 1,122 through holes 23 having a diameter in the range of 0.010 inches to 0.020 inches and preferably in the range of 0.014 inches to 0.016 inches. Through holes 23 are arranged, in this embodiment, in a generally circular pattern. Blocker plate 24 has a thickness approximately in the range of 0.180 to approximately 0.190 inches. Preferably, the thickness of blocker plate 24 is 0.185 inches. Blocker plate 24 assists in creating a uniform flow of gas in chamber body 45 by spreading the relatively narrow stream of process gas through gas distribution port 20 over the area of blocker plate 24.

Figure 14:
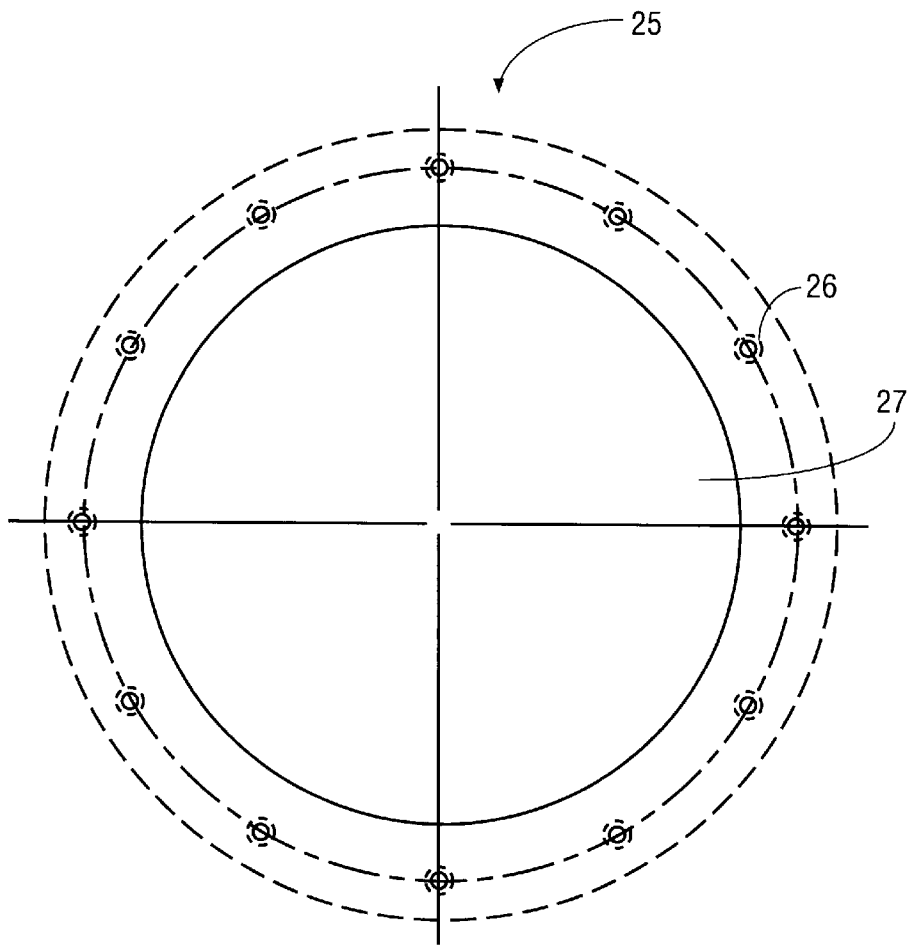
FIG. 14 shows a top plan view of a face plate in accordance with an embodiment of the invention
Figure 15:
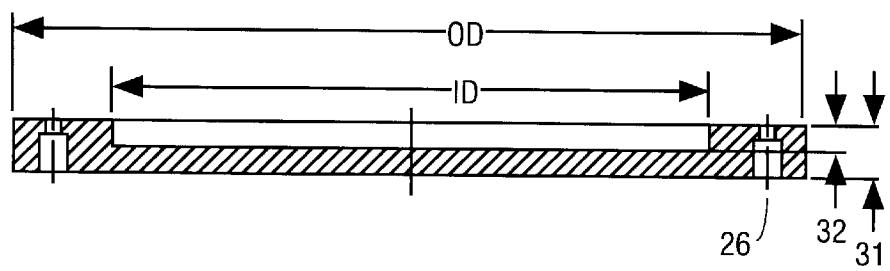
FIG. 15 shows a cross-sectional side view of a face plate in accordance with an embodiment of the invention.
Figure 16:
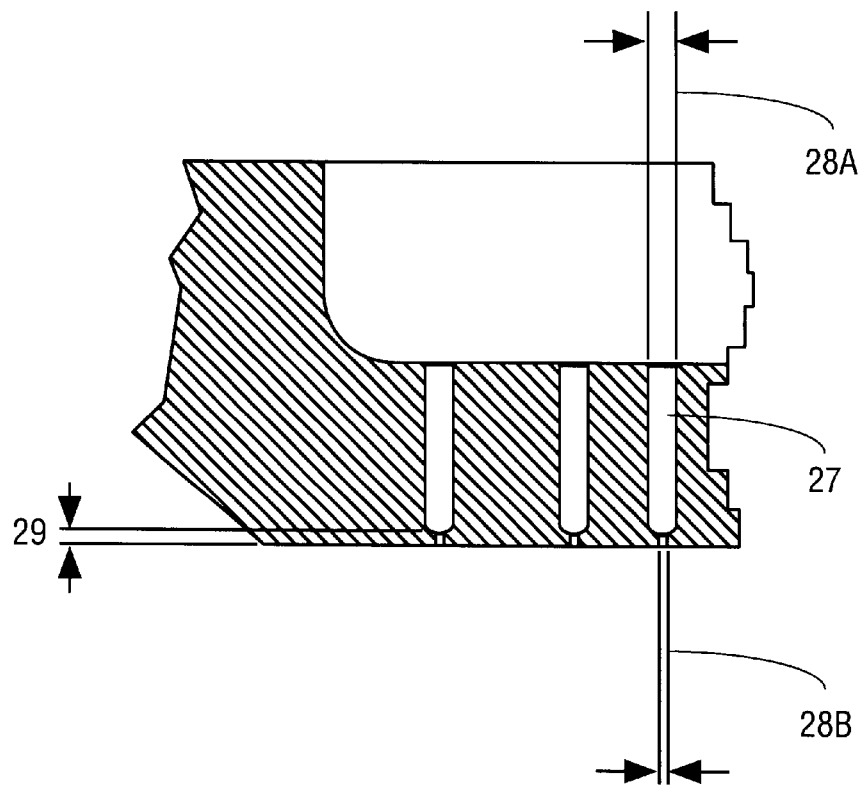
FIG. 16 shows a cross-sectional side view of a portion of a face plate in accordance with an embodiment of the invention.

FIGS. 14–15 show a top and side plan view, respectively of face plate 25. FIG. 16 shows a cross-sectional side plan view of a portion of face plate 25. Face plate 25 is circular in shape. Face plate 25 serves in one aspect to assist in the uniform distribution of process gas over a wafer. Process gas already redistributed to the circumferential area of blocker plate 24 is further restricted as the gas contacts face plate 25. In one embodiment, through holes in face plate 25 have a similar diameter as through holes in blocker plate 24.

Face plate 25 is substantially circular in shape and is coupled to chamber lid 30 through circumferentially-arranged fastening holes 26. Though holes 27 in the central portion of the face plate 25 extend through face plate 25. In the embodiment of an eight liter processing chamber described above, the inner diameter of a perforated face plate may range from approximately 9.10 to 9.30 inches and an outer diameter that may range from approximately 10.7 to 10.10 inches of perforated face plate 25. Face plate 25 includes two stepped portions. A thickness of exterior portion 31 to couple face plate 25 to a chamber is approximately 0.800 inches while the inner portion 32 having through holes 27 is approximately 0.400 inches.

In one embodiment, though holes 27 in the inlet side of perforated face plate 25 have a larger diameter than the outlet side where the process gas enters the reaction portion of the chamber. One reason for this is mechanical constraints of forming appropriate diameter through holes in the material, e.g., damaging drill bits. FIGS. 16 shows the difference in diameters between the inlets and outlets of through holes 27 in perforated face plate 25. Inlet 28A to each through hole (gas inlets are located at the superior side of perforated face plate 25 adjacent to blocker plate 24) has a diameter of about 0.62 inches which is larger than outlet diameter 28B of 0.016 inches. The depth of the gas hole is approximately 0.400 inches. The smaller diameter opening has a length (numerically represented by reference numeral 29) of approximately 0.030 inches.

The method for processing a semiconductor wafer according to the invention will now be described. Wafer is first positioned onto the upper surface of susceptor 5 with a support blade (not shown) of the robotic wafer transfer system. Susceptor 5 is raised into the upper processing position within process chamber 45 via conventional means, such as a hydraulic lift, so that wafer resides within central opening of plate 85. Chamber 45 is then evacuated to a suitable vacuum pressure, while the wafer and susceptor 5 are suitably heated. Process gases, such as $SiH_4$ and $NH_3$, are mixed in a chamber of a manifold head (not shown) and introduced through inlet 20 through blocker plate 24 and distributed uniformly over wafer via perforated face plate 25. Depending on the particular process, the process gas will contact the wafer and form a film, such as an oxide or nitride film.

During the deposition process, pump 32 is activated to generate vacuum pressure within pumping channel 414, thereby drawing the process gases and/or plasma residue out of processing chamber 90 through gas holes 490 of pumping plate 85. In addition, purge gas (bottom purge gas) 1030 such as nitrogen may be directed through inlet 18 and into processing chamber 90 through the gap between susceptor and pumping plate 85. The purge gas minimizes leakage of process gas into the lower portion of the chamber. The residual gas and purge gas flow uniformly into gas holes 490 and into pumping channel 414. The exiting gases are discharged through vacuum pump-out 31 and discharged along line 33.

Pumping plate 85 separates the gas flow into two flow regions: a first flow region 1000 directed at the surface of susceptor 5 (or a wafer on susceptor 5) and a second flow region 1010 in channel 414 and in communication with channel 4140. In one aspect, the invention contemplates that a pressure difference between a pressure measured in first flow region and a pressure measured in second flow region 1030 will be similar at all points around the chamber. The consistent pressure difference contributes to a uniform flow of gas through the chamber and a more uniform film deposition on a wafer. By operating in ranges of chamber pressure greater than 100 Torr, the process offers greater flexibility in deposition rate and a reduction in temperature sensitivity across the wafer than prior processes operating in ranges of less than 100 Torr. The reduction in temperature sensitivity yields a more uniform film deposition across a wafer than prior art processes.

While the above is a description of the specific embodiments, various modifications, alternative constructions and equivalents may be used. For example, although the invention was described in detail with respect to a $Si_3N_4$ film deposition process, the invention is suitable for other deposition process, including but not limited to $SiO_2$ and polysilicon. In addition, although the invention is shown and described as a CVD reactor in, for example, a multi-chamber processing system, it not intended to be limited in this manner. That is, the invention can be used in a variety of processing chambers, such as chemical or physical vapor deposition chambers, or cooling chambers to, for example, cool the wafer after high temperature processing. It should be further noted that the invention is not limited to a single wafer chamber as described above and shown in the enclosed drawings. For example, the pumping plate could be installed into batch chambers that simultaneously perform processing on a plurality of wafers. In addition, the invention is suitable for use in a multi-wafer chamber that sequentially performs individual processing steps on each of the wafers.

What is claimed is:

1. A method for directing gas flow through a processing chamber comprising:
   introducing a supply of first gas through holes in a perforated face plate to form a first linear flow region over a wafer within the processing chamber;
   distributing a second gas in the processing chamber radially about a second portion of the processing chamber to form a second flow region wherein said second flow region is in communication with a pumping channel through first and second openings;
   establishing a static pressure difference between the first linear flow region and the second flow region throughout the chamber, and
   flowing a purge gas from a second zone into the first linear flow region through a gap between a susceptor and an annular shaped pumping plate.

2. The method of claim 1, wherein the distributing of the second gas comprises distributing the second gas through the annularly shaped pumping plate surrounding the wafer displaced in the chamber to define a radially disposed channel between the pumping plate and a wall of the chamber and delivering the gas in the first linear flow region through circumferentially spaced holes in the annularly shaped pumping plate.

3. A method of fabricating an integrated circuit device comprising:
   loading a wafer onto a susceptor within a processing chamber;
   introducing a supply of process gas through a gas inlet, directing gas through a blocker plate and a perforated face plate to form a first flow region over the wafer;
   introducing a supply of purge gas from a second zone through a gap between the susceptor and a pumping plate into the first flow region;
   distributing the process gas and the purge gas into the pumping plate circumscribing the wafer, the pumping plate having an annular body-with an opening therethrough with a longitudinal component and a lateral component extending away from the opening and having a plurality of through holes circumferentially spaced about an axis along longitudinal component,
   wherein the pumping plate is displaced in the chamber such that the longitudinal component and the wall of the chamber define a channel of a second flow region and wherein said second flow region is in communication with a pumping channel through a first and second opening through said lateral component.

4. The method of claim 3, further comprising establishing a static pressure difference between the first flow region and the second flow region throughout the chamber.

5. An apparatus comprising:
   a pumping plate for a processing chamber having an annular body member wherein said body member has a first portion and a second portion defining a circumferential edge and a central opening,
   wherein the first portion comprises a sidewall of the circumferential edge having a plurality of circumferentially spaced through holes and the second portion has a lateral portion that protrudes from the circumferential edge, such that, in a processing chamber, the first portion defines a first region comprising the central opening and a second region comprising the lateral portion of the second portion, and wherein the second portion comprises two lateral flanges, each lateral flange having an area in proportion to an arc defined between two radii on the annular body member,
   a susceptor positioned within the pumping plate during processing wherein a gap between the pumping plate and the susceptor allows for a flow of a purge gas into the first region.

6. The pumping plate of claim 3, wherein the gas holes in the first portion are substantially arranged symmetrically about an axis.

7. The pumping plate of claim 3, wherein the sidewall of the first portion is adapted to separate the first region from the second region such that the two regions communicate through the through holes.

8. The pumping plate of claim 4, wherein the first portion comprises 48 through holes.

9. An apparatus for fabricating an integrated circuit device comprising:
   an enclosure housing a processing chamber, the enclosure defining a gas inlet in communication with the processing chamber for receiving processing gas and a gas outlet for discharging the processing gas;
   a susceptor disposed within the processing chamber for supporting a wafer thereon;
   a pumping plate having an annular body with an opening therethrough with a longitudinal component and a lateral component extending away from the opening and having a plurality of through holes circumferentially spaced about an axis along longitudinal component and said lateral component having two openings formed therein, and
   the pumping plate is displaced in the chamber such that an area through the opening in the pumping plate defines a first flow region over a surface of the susceptor and the longitudinal component and the wall of the chamber define a channel of a second flow region wherein during processing, a gap exists between the susceptor and the pumping plate to allow a flow of a gas from a second zone beneath the susceptor into the first flow region.

10. The apparatus of claim 9, wherein the channel communicates with the gas outlet through the holes in the pumping plate and a pump for drawing gas from the processing chamber, the pumping channel being disposed radially outward from the processing chamber and the susceptor.

11. The apparatus of claim 9, wherein the gas inlet is configured about a superior surface of the chamber and the pump is configured about one side surface of the chamber.

12. The apparatus of claim 9, wherein the enclosure has a superior surface that defines a superior surface of the chamber, the gas inlet communicating with the chamber through the superior surface, the apparatus further comprising:

a source plate coupled adjacent the superior surface and having a perforated area corresponding with the area defined by the opening in the annular body of the pumping plate.

13. The apparatus of claim 12, wherein the source plate is a first source plate having a first surface adjacent the superior surface of the chamber and an opposing second surface, the apparatus further comprising a second source plate coupled adjacent the second surface of the first source plate, the second source plate having a perforated area corresponding with the area defined by the opening in the annular body of the pumping plate, wherein openings of the perforated area of the second source plate comprise a smaller diameter than openings of the perforated area of the first source plate.

14. The apparatus of claim 13, wherein the second source plate has a first surface adjacent the second surface of the first source plate and an opposing second surface and the openings of the perforated area of the second source plate have a first diameter about the first surface and a second diameter about the second surface.

15. An apparatus for fabricating an integrated circuit device comprising:

an enclosure housing a processing chamber, the enclosure defining a gas inlet in communication with the processing chamber for receiving processing gas and a gas outlet for discharging the processing gas;

a susceptor disposed within the processing chamber for supporting a wafer thereon; and a pumping plate having an annular body with an opening therethrough with a longitudinal component and a lateral component extending away from the opening and having a plurality of through holes circumferentially spaced about an axis along the longitudinal component and wherein the lateral component comprises two lateral langes, wherein the pumping plate is displaced in the chamber such that an area through the opening in the pumping plate defines a first flow region over a surface of the susceptor and the longitudinal component and the wall of the chamber define a channel of a second flow region, the enclosure has a superior surface that defines a superior surface of the chamber, the gas inlet communicating with the chamber through the superior surface, the apparatus further comprising:

a source plate coupled adjacent the superior surface and having a perforated area corresponding with the area defined by the opening in the annular body of the pumping plate, and the source plate is a first source plate having a first surface adjacent the superior surface of the chamber and an opposing second surface, the apparatus further comprising a second source plate coupled adjacent the second surface of the first source plate, the second source plate having a perforated area corresponding with the area defined by the opening in the annular body of the pumping plate, wherein openings of the perforated area of the second source plate comprise a smaller diameter than openings of the perforated area of the first source plate.

16. The apparatus of claim 15, wherein the second source plate has a first surface adjacent the second surface of the first source plate and an opposing second surface and the openings of the perforated area of the second source plate have a first diameter about the first surface and a second diameter about the second surface.

17. The apparatus of claim 15, wherein the channel communicates with the gas outlet through the holes in the pumping plate and a pump for drawing gas from the processing chamber, the pumping channel being disposed radially outward from the processing chamber and the susceptor.

18. The apparatus of claim 15, wherein the gas inlet is configured about a superior surface of the chamber and the pump is configured about one side surface of the chamber.

* * * * *